US006624776B2

(12) United States Patent
Oliveira

(10) Patent No.: US 6,624,776 B2
(45) Date of Patent: Sep. 23, 2003

(54) METHOD AND SYSTEM FOR ADJUSTING THE DYNAMIC RANGE OF AN ANALOG-TO-DIGITAL CONVERTER IN A WIRELESS COMMUNICATIONS DEVICE

(75) Inventor: Louis Dominic Oliveira, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/906,872

(22) Filed: Jul. 16, 2001

(65) Prior Publication Data

US 2003/0011498 A1 Jan. 16, 2003

(51) Int. Cl.[7] .................................................. H03M 1/12
(52) U.S. Cl. ........................ 341/155; 341/118; 341/120; 341/139
(58) Field of Search ................................. 341/110–172

(56) References Cited

U.S. PATENT DOCUMENTS

| 4,618,850 | A | * | 10/1986 | Lenhoff, Jr. ................. 341/118 |
| 5,422,643 | A | * | 6/1995 | Chu et al. .................... 341/141 |
| 5,899,977 | A | * | 5/1999 | Nakamura ................... 704/278 |
| 6,134,430 | A | * | 10/2000 | Younis et al. ............. 455/232.1 |
| 6,163,508 | A | * | 12/2000 | Kim et al. ...................... 369/7 |

* cited by examiner

Primary Examiner—Michael Tokar
Assistant Examiner—Linh Van Nguyen
(74) Attorney, Agent, or Firm—Philip R. Wadsworth; Charles D. Brown; George C. Pappas

(57) ABSTRACT

A wireless communication device (100) may include a transmitter (108), a memory (104), an analog-to-digital converter (128), an audio playback system (124) and other features. A dynamic range controller (130) selectively generates control signals to adjust, at least in part, the operational dynamic range of the analog-to-digital converter (128) for analog signals received by the a transmitter (108) or stored in the memory (104). The selection of dynamic range is based on identifying a characteristic. In one embodiment, the control signals are used to selectively operate the analog-to-digital converter (128) at a particular dynamic range based on a sampling rate set by the remote location or by the user.

6 Claims, 3 Drawing Sheets

METHOD AND SYSTEM FOR ADJUSTING THE DYNAMIC RANGE OF AN ANALOG-TO-DIGITAL CONVERTER IN A WIRELESS COMMUNICATIONS DEVICE

This application is related to U.S. application Ser. No. 09/793,337, entitled "METHOD AND SYSTEM FOR ADJUSTING THE DYYNAMIC RANGE OF A DIGITAL-TO-ANALOG CONVERTER IN A WIRELESS COMMUNICATIONS DEVICE," filed Feb. 26, 2001, commonly assigned.

FIELD OF THE INVENTION

The present invention is directed generally to a wireless communication device, and, more particularly, to a method and system for adjusting the dynamic range of an analog-to-digital converter in a wireless communication device.

BACKGROUND OF THE INVENTION

Wireless communication devices, such as cellular telephones, frequently include an analog-to-digital converter to convert analog signals into digital audio signals for recording voice or music or transmitting that music or voice over the air.

The typical wireless communications device is battery-powered. Conservation of battery power is important to increase the operating duration of the device. Operating the analog-to-digital converter with a high dynamic range consumes a significant amount of power and therefore decreases the operating time of the device. Accordingly, it can be appreciated that there is a significant need for a method and system for adjusting the operational dynamic range of an analog-to-digital converter in a wireless communications device. The present invention provides this and other advantages as will be apparent from the following detailed description and accompanying figures.

SUMMARY OF THE INVENTION

The present invention is embodied in a method and system for adjusting the operational dynamic range of an analog-to-digital converter in a wireless communication device. In one embodiment, the system includes a transmitter, a memory, an analog-to-digital converter. The system transmits an analog input signal to a remote location and determines the appropriate dynamic range at which to operate the analog-to-digital converter. In another embodiment, the system determines the appropriate dynamic range at which to operate the analog-to-digital converter to record an analog signal to be stored in memory.

DETAILED DESCRIPTION OF THE PREFERRED EMBODIMENTS

The present invention provides intelligent control of an analog-to-digital converter in a wireless communication device, and, as a result, reduces battery drain. The present invention may be readily implemented in any wireless communication device. Although the examples presented herein refer to a cellular telephone, the principals of the present invention are applicable to any wireless communication device, including, but not limited to, analog and digital cellular telephones, personal communication system (PCS) devices, and the like.

Figure 1:
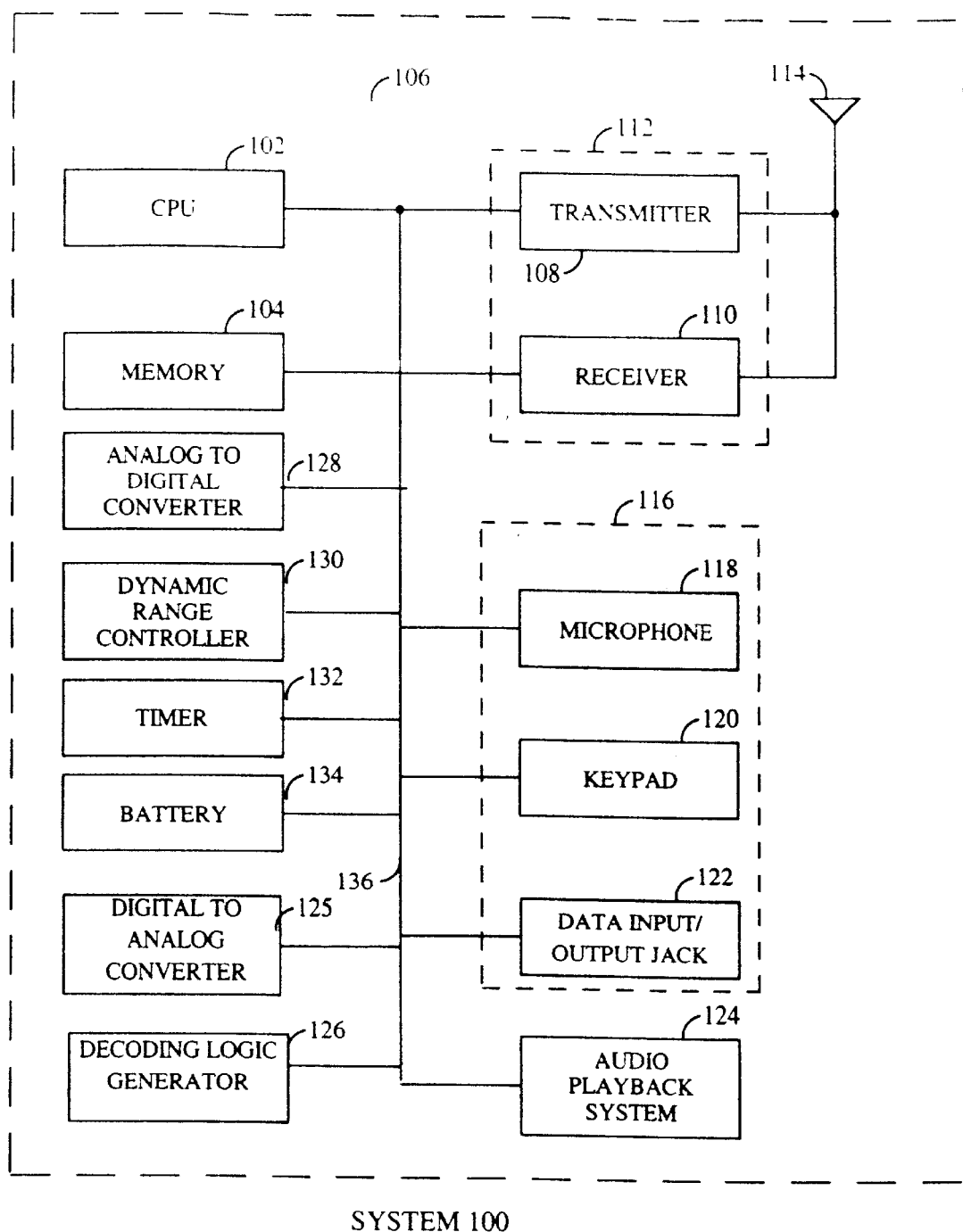
FIG. 1 is a functional block diagram of a wireless communication device implementing the present invention.

The present invention is embodied in a system 100 illustrated in the functional block diagram of FIG. 1. The system 100 includes a central processing unit (CPU) 102, which controls operation of the system. The CPU 102 may be satisfactorily implemented with a number of different computing devices, such as a microprocessor, microcontroller, custom-designed processor, application specific integrated circuit (ASIC), digital signal processor (DSP), or the like. The system 100 is not limited by the specific form of the CPU 102. A memory 104, which may include read-only memory (ROM), flash memory and/or random-access memory (RAM), provides instructions and data to the CPU 102. A portion of the memory 104 may also include non-volatile random-access memory.

The system 100, which is typically embodied in a wireless communication device such as a cellular telephone, also includes a housing 106 that contains a transmitter 108 and a receiver 110 to allow transmission and reception of data, such as audio communications and programming data, between the system 100 and a remote location, such as a base transceiver station (BTS) 150 (see FIG. 2), or the like. The transmitter 108 and the receiver 110 may be combined into a transceiver 112. An antenna 114 is attached to the housing 106 and electrically coupled to the transceiver 112. The operation of the transmitter 108, receiver 110, and antenna 114 is well-known in the art and need not be described herein. Although FIG. 1 illustrates the antenna 114 as extending from the housing 106, some designs may include an internal antenna that is contained completely within the housing. The transmitter 108, the receiver 110, and the antenna 114, however, operate in a conventional manner regardless of the location of the antenna.

A user-input device 116 is communicatively linked to the system 100 for operation by the user in a conventional manner. The user-input device 116 provides a convenient means by which destination telephone numbers, commands, digital images, audio data and other data may be entered by the user. Although FIG. 1 illustrates the user-input device 116 as comprising a microphone 118, a keypad 120, and a data-input/output jack 122 contained within the housing 106, other user output devices may be used, such as the transmitter 108, and the like, and in various combinations.

Figure 2:
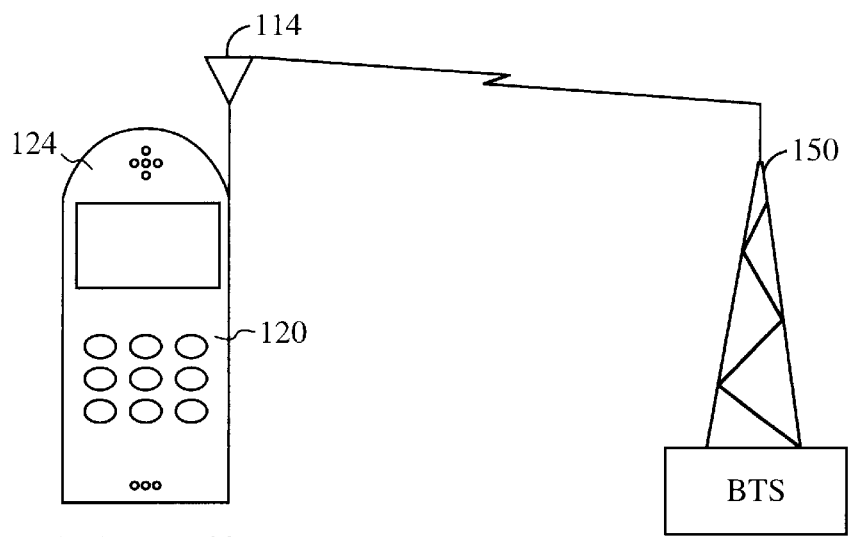
FIG. 2 illustrates the operation of the system of FIG. 1 to transmit audio data to a remote location.

The system 100 also includes an audio playback system 124 that may be conveniently used to reproduce audio signals. Although FIG. 2 illustrates the audio playback system 124 as comprising a speaker, one skilled in the art will recognize that the audio playback system 124 may be comprised of other components, such as an amplifier (not shown), the data input/output jack 122, a headset (not shown), or a headphone (not shown).

The system includes a digital-to-analog converter (DAC) 125 that may be conveniently used to convert digital audio signals to analog audio signals for playback by the audio playback system 124. The DAC 125 may be configured to operate over various dynamic range settings or to shut down. The desired operational dynamic range of the DAC 125 may be related to the characteristics of the signal to be played back. For example, voice signals may be satisfactorily reproduced when the DAC 125 is set to operate at a particular dynamic range, but musical signals may require a higher dynamic range for satisfactory reproduction. Alternatively, the desired dynamic range may be related to another characteristic, such as a characteristic of user input received by the system 100. One skilled in the art will recognize that the specific dynamic range for a particular characteristic is a matter of engineering design choice. The particular manner in which the DAC 125 operates is not the subject of this invention and need not be discussed in detail herein.

The system also includes an analog-to-digital converter (ADC) 128 that may be conveniently used to convert analog audio signals to digital audio signals for storing into memory 104 or sent over the air via the transmitter 108 to a remote location. The ADC 128 may be configured to operate over various dynamic range settings or to shut down. The desired operational dynamic range of the ADC 128 may be related to the characteristics of the signal to be stored or transmitted. For example, voice signals may be satisfactorily stored or transmitted when the ADC 128 is set to operate at a particular dynamic range, but musical signals may require a higher dynamic range for satisfactory recording or playback. Alternatively, the desired dynamic range may be related to another characteristic, such as a characteristic of user input received by the system 100. One skilled in the art will recognize that the specific dynamic range for a particular characteristic is a matter of engineering design choice.

For example, the ADC 128 may be configured to operate with a dynamic range of 75 dB to convert analog voice data to digital audio signals. Similarly, the ADC 128 may be configured to operate with a dynamic range of 90 dB to convert analog musical data to digital audio signals. One skilled in the art will recognize that the ADC 128 may also be implemented as part of an ASIC (not shown), or the like, containing other components of the system 100, such as the CPU 102.

The system 100 also includes a dynamic range controller (DRC) 130, which processes digital signals and which may typically be implemented as a set of program instructions executed by the CPU 102. As will be discussed in greater detail below, the system 100 may use the DRC 130 to selectively generate a control signal to adjust the operational dynamic range of the ADC 128 based on an identified characteristic. The identified characteristic may be a characteristic of a received digital signal from a Decoding Logic Generator 126, a characteristic of a stored digital signal, a characteristic of another input, or the like. One skilled in the art will recognize that the DRC 130 may be configured to selectively generate the control signal by the user or may be preset to do so at the factory, or some combination thereof.

The identified characteristics of a digital signal may include the type of signal (ie., voice, musical, or non-audio), the sampling rate (e.g. 8 KHz, 16 KHz, 22.05 KHz, 24 KHz, 32 KHz, 44.1 KHz or 48 KHz sampled data), and the like, and various combinations thereof. The identified characteristics of other inputs may include user commands to record analog signals in a particular manner or at a particular time, user settings indicating that a particular type of analog signal will be received, user power-mode settings, or the like, and various combinations thereof.

In one embodiment, the system 100 may also include a timer 132 for operation by the system to control the DRC 130 at predetermined time periods, as will be discussed in greater detail below. Electrical components of the system 100 receive power from a battery 134, which is attached to and supported by the housing 106. In an exemplary embodiment, the battery 134 is a rechargeable battery. In other embodiments, the system 100 may include a connector (not shown) for the connection of an external power source, such as an automobile power adapter, AC power adapter, or the like.

The various components of the system 100 are coupled together by a bus system 136 which may include a power bus, control bus, and status signal bus in addition to various data busses. For the sake of clarity, however, the various buses are illustrated in FIG. 1 as the bus system 136.

The operation of the system 100 to adjust the dynamic range of the ADC 128 may now be described more fully. For the sake of brevity, the system 100 will be described using a limited number of examples. Different examples may discuss different dynamic ranges. As discussed above, the specific dynamic range is typically selected based on the desired application. The present invention is not limited by a particular dynamic range or set of dynamic ranges.

In one embodiment the system 100 may be configured to generate control signals to adjust the operational dynamic range of the ADC 128 based on a characteristic of an input signal. FIG. 2 illustrates the operation of the system 100 to transmit an analog input audio signal to a remote location, such as the BTS 150. In this example, the system 100 may be configured to operate the ADC 128 with a dynamic range of 80 dB if an analog signal received by the microphone 118 or the DATA input/output jack 122 is a voice analog signal. The system 100 transmits a digital signal to the transmitter 108. The DRC 130 is configured to identify an input signal indicating the signal is a voice signal and, upon identifying the characteristic, to generate control signals such that the operational dynamic range of the ADC 128 is 80 dB. Similarly, the system may be configured to operate the ADC 128 with a dynamic range of 98 dB if an analog signal received by the DATA input/output jack 122 or the microphone 118 is a musical analog signal. One skilled in the art will recognize that the dynamic range controller 130 may be configured to selectively generate control signals based, at least in part, on a characteristic of a signal transmitted to the remote location by the user or may be preset to do so at the factory, or some combination thereof.

One skilled in the art also will recognize that the DRC 130 may be configured to identify a determined characteristic of a received signal in a variety of different ways. For example, the DRC 130 may monitor an input decoding logic signal that indicates the audio signal is of a particular type (i.e., a voice signal or a music signal). Similarly, an input decoding logic signal may have a particular sampling rate information (such as 8 KHz, 16 KHz, 22.05 KHz, 24 KHz, 32 KHz, 44.1 KHZ, or 48 KHz sampled data) based on the type of audio signal. For example, voice signals typically have lower bandwidth requirements and can use a lower sampling rate (e.g., 8 KHz) while musical signals have high bandwidth requirements and need a higher sampling rate (e.g., 48 KHz). The DRC 130 may be configured to identify the sampling rate and generate control signals based on the particular input decoding logic signal. The particular manner in which the DRC 130 identifies a characteristic of a received signal is not the subject of this invention and need not be discussed in detail herein.

In another embodiment, the user may desire to restrict operation of the ADC 128 based upon a time-related characteristic. For example, the user may desire to allow recording of voice signals but prohibit recording of musical signals between the hours of 9:00 A.M. and 5:00 P.M. In this example, the DRC 130 may be configured to monitor a timing signal from the timer 132 and to generate control signals to operate the ADC 128 with a dynamic range of 80 dB between the hours of 9:00 A.M. and 5:00 P.M. Similarly, the user may desire to disable all audio recording or transmission between 5:00 P.M. and 7:00 P.M. In this example, the DRC 130 may be configured to power down the ADC 128 between the hours of 5:00 P.M. and 7:00 P.M.

In another embodiment, the user may desire to adjust the operational dynamic range of the ADC 128 based on user input. For example, the user may wish to manually configure the system 100 to operate the ADC 128 with a dynamic range of 80 dB. In this example, the user inputs commands through the user-input device 116 to operate the ADC 128 with a dynamic range of 80 dB. The DRC 130 is configured to operate the ADC 128 with a dynamic range of 80 dB.

Figure 3:
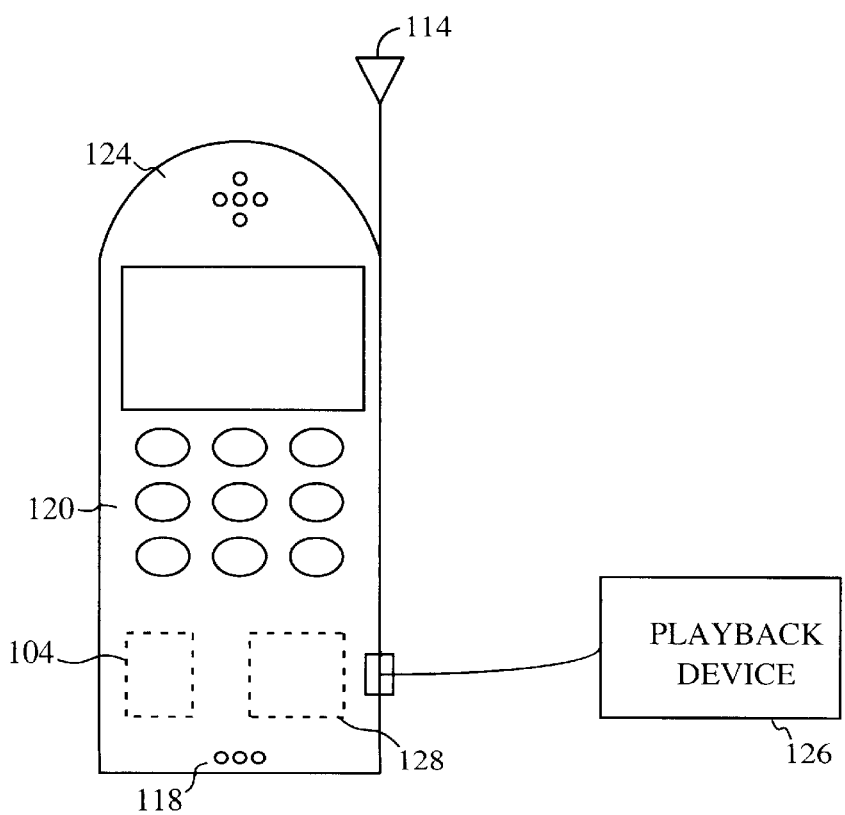
FIG. 3 illustrates the operation of the system of FIG. 1 to record and store audio data from a playback system.

In another embodiment, the user may desire to store analog audio signals into memory 104. FIG. 3 illustrates the operation of the system 100 to store an analog audio signal into memory 104 from a playback device 126. This playback device could be a FM/AM stereo receiver or a CD/MINI DISC player or others. In this example, the user may want to store voice messages in the memory 104 for later playback or configure the system 100 to store music in the memory 104 for later playback. In this embodiment, the system 100 may be configured to generate control signals to adjust the operational dynamic range of the ADC 128 based on a characteristic of an input signal. For example, the system 100 may be configured to operate the ADC 128 with a dynamic range of 75 dB if the particular input decoding logic signal indicates a voice signal. The DRC 130 is configured to identify a characteristic of the signals based on the particular input decoding logic signal indicating the signal is a voice signal, such as the sampling, and, upon identifying the characteristic, to generate control signals such that the operational dynamic range of the ADC 128 is 75 dB. Similarly, the system may be configured to operate the ADC 128 with a dynamic range of 90 dB if the particular input decoding logic signal indicates a musical signal. One skilled in the art will recognize that the dynamic range controller 130 may be configured to selectively generate control signals based, at least in part, on a characteristic of the input decoding logic signal set by the user or may be preset to do so at the factory, or some combination thereof.

One skilled in the art will recognize that the DRC 130 may generate control signals to control the operation of other components of the system 100 to facilitate processing of the input analog signal. For example, the DRC 130 may generate control signals to control the configuration of the bus system 136 (see FIG. 1). The bus system 136 can be configured to have a 13-bit data path for digital voice signals and a 16-bit data path for digital musical signals.

Figure 4:
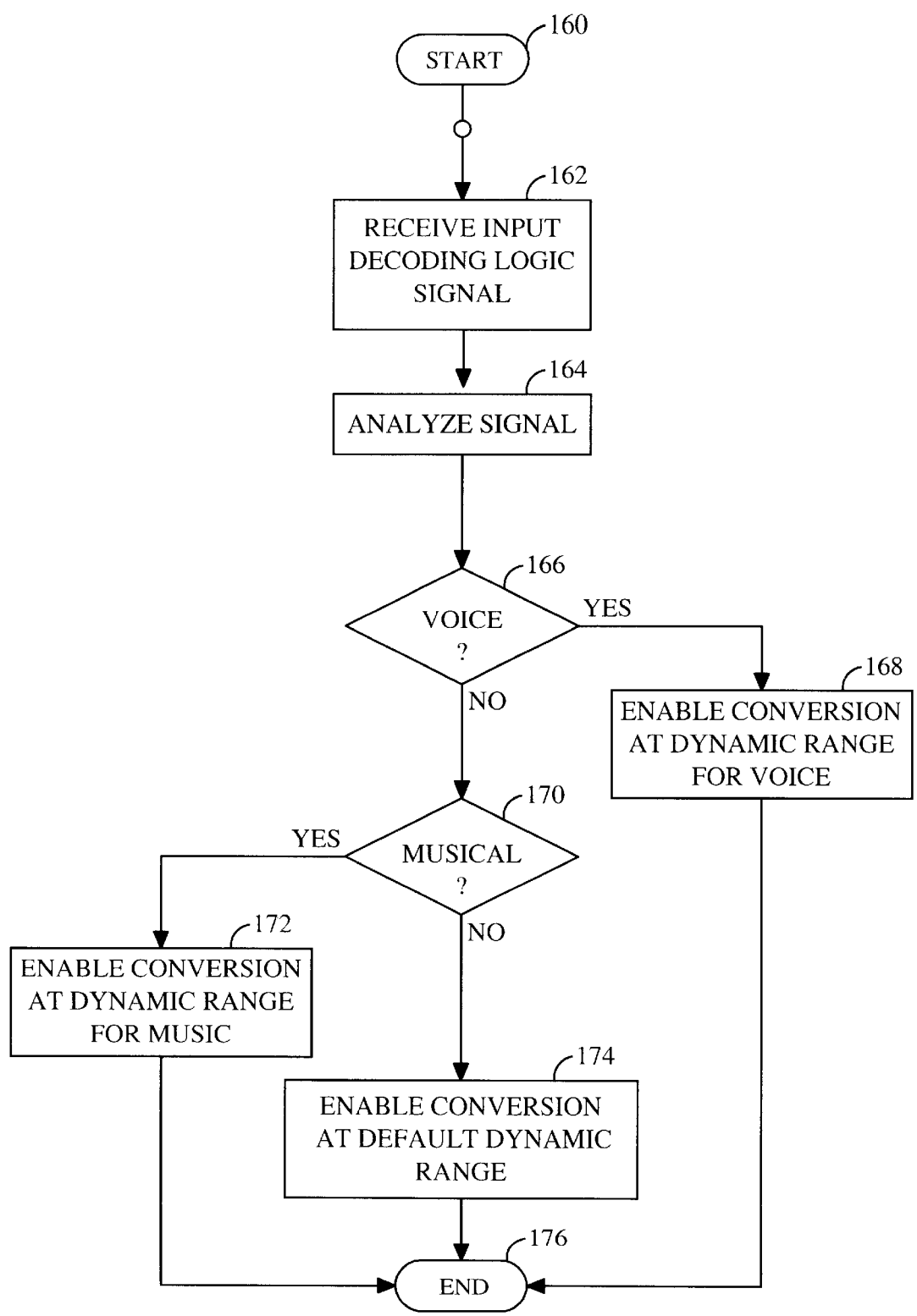
FIG. 4 is a flowchart illustrating the operation of the system of FIG. 1 to adjust the operational dynamic range of an analog-to-digital converter.

The operation of the system 100 to control the operational dynamic range of the ADC 128 based on the type of input decoding logic signal is illustrated in FIG. 4. At a start 160, the wireless communications device is under power. A step 162 the system 100 receives an input decoding logic signal from a remote location or from the user (see FIG. 1).

At step 164, the input decoding logic signal is analyzed. The type of characteristics identified by the analysis has been discussed above. At decision 166 the system 100 identifies whether the received input decoding logic signal has a characteristic indicating it is a voice signal.

If the input decoding logic signal has a characteristic indicating it is a voice signal, the answer to decision 166 is YES. In that event the system proceeds to step 168. At step 168, the system 100 enables conversion of the analog voice signal to a digital voice signal at an operational dynamic range appropriate for a voice signal, such as 75 dB or 80 dB. The system 100 then ends the operation in step 176.

If the input decoding logic signal does not have a characteristic indicating it is a voice signal, the result of decision 166 is NO. In that event the system 100 proceeds to decision 170. At decision 170, the system 100 identifies whether the input decoding logic signal has a characteristic indicating it is a musical signal. If the input decoding logic signal has a characteristic indicating it is a musical signal, the answer to decision 170 is YES. In that event the system 100 proceeds to step 172. At step 172, the system 100 enables conversion of the analog musical signal to a digital musical signal at an operational dynamic range appropriate for a musical signal, such as 90 dB or 98 dB. The system 100 then ends the operation in step 176.

If the input decoding logic signal is not a musical signal, the answer to decision 170 is NO. In that event the system 100 proceeds to step 174. At step 174, the system 100 enables conversion of the analog audio signal to a digital audio signal at a default operational dynamic range, such as 90 dB. The system 100 then ends the operation in step 176.

Those skilled in the art will recognize that additional steps, such as error checking routines, may be performed. For the sake of brevity, those flowcharts will not be repeated herein. However, one of ordinary skill in the art may readily implement such processes based on the present disclosure.

Those skilled in the art will also recognize that the particular audio signal types, signal characteristics, user inputs, settings, dynamic ranges, sampling rates and time periods used above are illustrative only and that the present invention is not limited to the audio signal types, signal characteristics, user inputs, settings, dynamic ranges, sampling rates and time periods mentioned.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A integrated circuit for use in a wireless device, comprising:

an analog-to-digital converter (ADC) operable in a first dynamic range to conserve power when incoming signals to be converted by the ADC are to be processed as voice signals, and in a second dynamic range for better recording or playback when the incoming signals to be converted by the ADC are to be processed as musical signals;

means for detecting when signals processed by the ADC are to be processed as voice signals or musical signals; and means for controlling the ADC to operate at the first dynamic range or the second dynamic range in response to the detection.

2. The integrated circuit of claim 1, wherein the means for detecting includes means for identifying user settings defining whether at any given time the signals should be processed as voice signals or musical signals.

3. In a wireless device including an ADC and a dynamic range controller (DRC), the ADC being operable in a first dynamic range to conserve power when incoming signals to be converted by the ADC are to be processed as voice signals, and in a second dynamic range for better recording or playback when the incoming signals to be converted by the ADC are to be processed as musical signals, a method comprising the DRC performed steps of:

detecting when signals processed by the ADC are to be processed as voice signals or musical signals; and controlling the ADC to operate at the first dynamic range or the second dynamic range in response to the detection.

4. The method of claim 3, further comprising identifying user settings defining whether at any given time the signals should be processed as voice signals or musical signals.

5. A computer readable medium comprising instructions that, upon execution in a wireless device that includes an ADC and a DRC, where the ADC is operable in a first dynamic range to conserve power when incoming signals to be converted by the ADC are to be processed as voice signals, and in a second dynamic range for better recording or playback when the incoming signals to be converted by the ADC are to be processed as musical signals, detect when signals processed by the ADC are to be processed as voice signals or musical signals; and control the ADC to operate at the first dynamic range or the second dynamic range in response to the detection.

6. The computer readable media of claim 5, further comprising instructions to identify user settings defining whether at any given time the signals should be processed as voice signals or musical signals.

* * * * *